(12) United States Patent
Fukuda

(10) Patent No.: US 9,508,798 B2
(45) Date of Patent: Nov. 29, 2016

(54) SEMICONDUCTOR DEVICE

(71) Applicant: Kabushiki Kaisha Toshiba, Minato-ku, Tokyo (JP)

(72) Inventor: Tatsuo Fukuda, Hakusan Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/840,074

(22) Filed: Aug. 31, 2015

(65) Prior Publication Data

US 2016/0276435 A1  Sep. 22, 2016

(30) Foreign Application Priority Data

Mar. 16, 2015 (JP) ................... 2015-051580

(51) Int. Cl.
| | |
|---|---|
| *H01L 29/76* | (2006.01) |
| *H01L 29/06* | (2006.01) |
| *H01L 29/78* | (2006.01) |
| *H01L 29/10* | (2006.01) |
| *H01L 29/08* | (2006.01) |

(52) U.S. Cl.
CPC ......... *H01L 29/0696* (2013.01); *H01L 29/086* (2013.01); *H01L 29/1095* (2013.01); *H01L 29/7813* (2013.01)

(58) Field of Classification Search
CPC .................................................. H01L 29/7397
USPC ........................................................ 257/334
See application file for complete search history.

(56) References Cited

U.S. PATENT DOCUMENTS

| | | |
|---|---|---|
| 6,323,509 B1 | 11/2001 | Kusunoki |
| 6,353,252 B1 | 3/2002 | Yasuhara et al. |
| 6,555,873 B2 | 4/2003 | Disney et al. |

(Continued)

FOREIGN PATENT DOCUMENTS

| | | |
|---|---|---|
| EP | 1073123 A2 | 1/2001 |
| JP | 2000-200906 A | 7/2000 |

(Continued)

OTHER PUBLICATIONS

Run-yan Miao et al., "Deep oxide trench termination structure for super-junction MOSFET", Electronics Letter, Aug. 2, 2012, vol. 48, No. 16.

(Continued)

*Primary Examiner* — Chandra Chaudhari
(74) *Attorney, Agent, or Firm* — White & Case LLP

(57) ABSTRACT

According to one embodiment, a semiconductor device includes a first semiconductor region of a first conductivity type, a second semiconductor region of the first conductivity type, a third semiconductor region of a second conductivity type, an insulating section, and a semiconductor section. The second semiconductor region is provided on the first semiconductor region. A carrier concentration of the first conductivity type of the second semiconductor region is lower than a carrier concentration of the first conductivity type of the first semiconductor region. The third semiconductor region is provided on the second semiconductor region. The insulating section is provided around the first semiconductor region and the second semiconductor region. The insulating section is in contact with the second semiconductor region. The semiconductor section is provided around the insulating section. The semiconductor section is not in contact with the first semiconductor region.

10 Claims, 14 Drawing Sheets

(56) References Cited

U.S. PATENT DOCUMENTS

| | | |
|---|---|---|
| 6,605,830 B1 | 8/2003 | Kusunoki |
| 6,635,544 B2 | 10/2003 | Disney |
| 6,667,213 B2 | 12/2003 | Disney |
| 6,750,105 B2 | 6/2004 | Disney |
| 6,798,020 B2 | 9/2004 | Disney et al. |
| 6,806,548 B2 * | 10/2004 | Shirai .................. H01L 29/475 257/334 |
| 6,815,293 B2 | 11/2004 | Disney et al. |
| 6,838,346 B2 | 1/2005 | Disney |
| 6,987,299 B2 | 1/2006 | Disney et al. |
| 7,253,042 B2 | 8/2007 | Disney |
| 7,745,291 B2 | 6/2010 | Disney |
| 7,781,310 B2 | 8/2010 | Grivna |
| 7,998,817 B2 | 8/2011 | Disney |
| 8,217,420 B2 | 7/2012 | Ogura |
| 8,384,151 B2 * | 2/2013 | Pfirsch ................ H01L 29/0834 257/328 |
| 8,940,605 B2 | 1/2015 | Disney |
| 2003/0047788 A1 | 3/2003 | Disney et al. |
| 2003/0047792 A1 | 3/2003 | Disney et al. |
| 2003/0049930 A1 | 3/2003 | Disney |
| 2003/0057524 A1 | 3/2003 | Disney |
| 2003/0060001 A1 | 3/2003 | Disney |
| 2003/0151110 A1 | 8/2003 | Disney et al. |
| 2004/0082122 A1 | 4/2004 | Disney |
| 2004/0104121 A1 | 6/2004 | Kaneko et al. |
| 2004/0232486 A1 | 11/2004 | Disney et al. |
| 2007/0293002 A1 | 12/2007 | Disney |
| 2008/0017897 A1 | 1/2008 | Saito et al. |
| 2008/0258211 A1 | 10/2008 | Sugi et al. |
| 2009/0218621 A1 | 9/2009 | Pfirsch et al. |
| 2009/0233407 A1 | 9/2009 | Disney |
| 2011/0042714 A1 | 2/2011 | Ogura |
| 2012/0015491 A1 | 1/2012 | Disney |

FOREIGN PATENT DOCUMENTS

| | | |
|---|---|---|
| JP | 2008-172201 A | 7/2008 |
| JP | 2013-021104 A | 1/2013 |

OTHER PUBLICATIONS

Tomonori Komachi et al., "A 1.7mm-Square 3.2kV Low Leakage Current Si MOSFET", Yokogawa Electric Corporation, 2006, IEEE.

Kota Seto et al., "Universal Trench Edge Termination Design", Proceedings of the 2012 24th International Symposium on Power Semiconductor Devices and ICs, Jun. 3-7, 2012, Bruges, Belgium, pp. 161-164.

Korean Office Action issued on Aug. 11, 2016 in counterpart Korean patent application No. 10-2015-0111039 and English Translation thereof.

Taiwanese Office Action issued on Aug. 16, 2016 in counterpart Taiwanese patent application No. 104128934 and English translation thereof.

* cited by examiner

SEMICONDUCTOR DEVICE

CROSS-REFERENCE TO RELATED APPLICATIONS

This application is based upon and claims the benefit of priority from Japanese Patent Application No. 2015-051580, filed on Mar. 16, 2015; the entire contents of which are incorporated herein by reference.

FIELD

Embodiments described herein relate generally to a semiconductor device.

BACKGROUND

Semiconductor devices such as diode, MOSFET (metal oxide semiconductor field effect transistor), and IGBT (insulated gate bipolar transistor) are used in e.g. power conversion circuits. It is desirable that such semiconductor devices have higher breakdown voltage.

DETAILED DESCRIPTION

Figure 1:
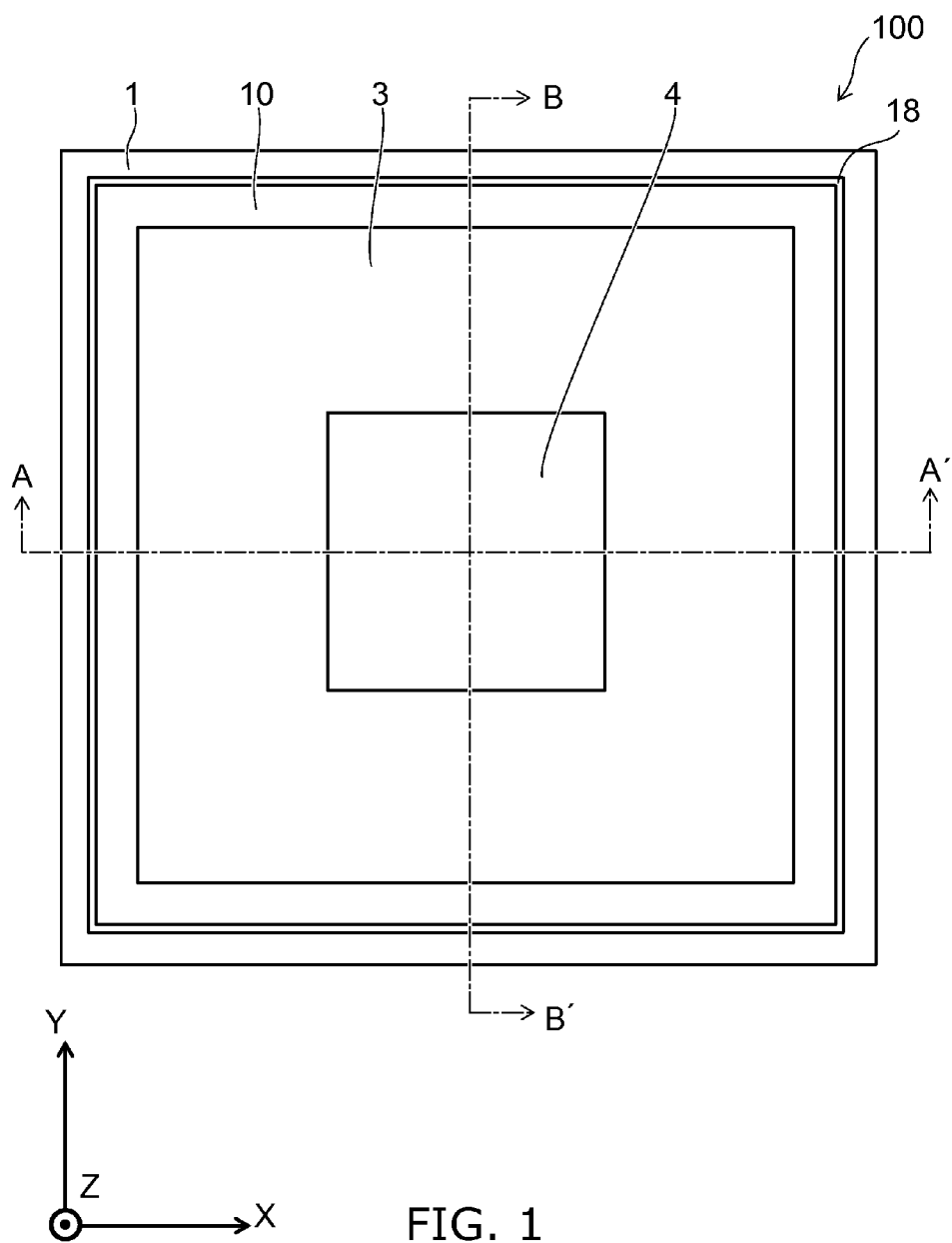
FIG. 1 is a plan view of a semiconductor device according to a first embodiment.

According to one embodiment, a semiconductor device includes a first semiconductor region of a first conductivity type, a second semiconductor region of the first conductivity type, a third semiconductor region of a second conductivity type, an insulating section, and a semiconductor section. The second semiconductor region is provided on the first semiconductor region. A carrier concentration of the first conductivity type of the second semiconductor region is lower than a carrier concentration of the first conductivity type of the first semiconductor region. The third semiconductor region is provided on the second semiconductor region. The insulating section is provided around the first semiconductor region and the second semiconductor region. The insulating section is in contact with the second semiconductor region. The semiconductor section is provided around the insulating section. The semiconductor section is not in contact with the first semiconductor region.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously are labeled with like reference numerals, and the detailed description thereof is omitted appropriately.

An XYZ orthogonal coordinate system is used in the description of the embodiments. For instance, two directions parallel to the major surface of a substrate used in fabricating a semiconductor device according to the embodiments and orthogonal to each other are referred to as X-direction and Y-direction. The direction orthogonal to both the X-direction and the Y-direction is referred to as Z-direction (first direction).

In the description of the embodiments, the notations of $n^+$, $n^-$ and $p^+$, p represent relative magnitude of impurity concentration in the respective conductivity types. More specifically, the symbol $n^+$ represents relatively higher n-type impurity concentration than $n^-$. The symbol $p^+$ represents relatively higher p-type impurity concentration than p.

The embodiments described below may be practiced by reversing the p-type and the n-type of each semiconductor region.

First Embodiment

FIG. 1 is a plan view of a semiconductor device 100 according to a first embodiment.

Figure 2:
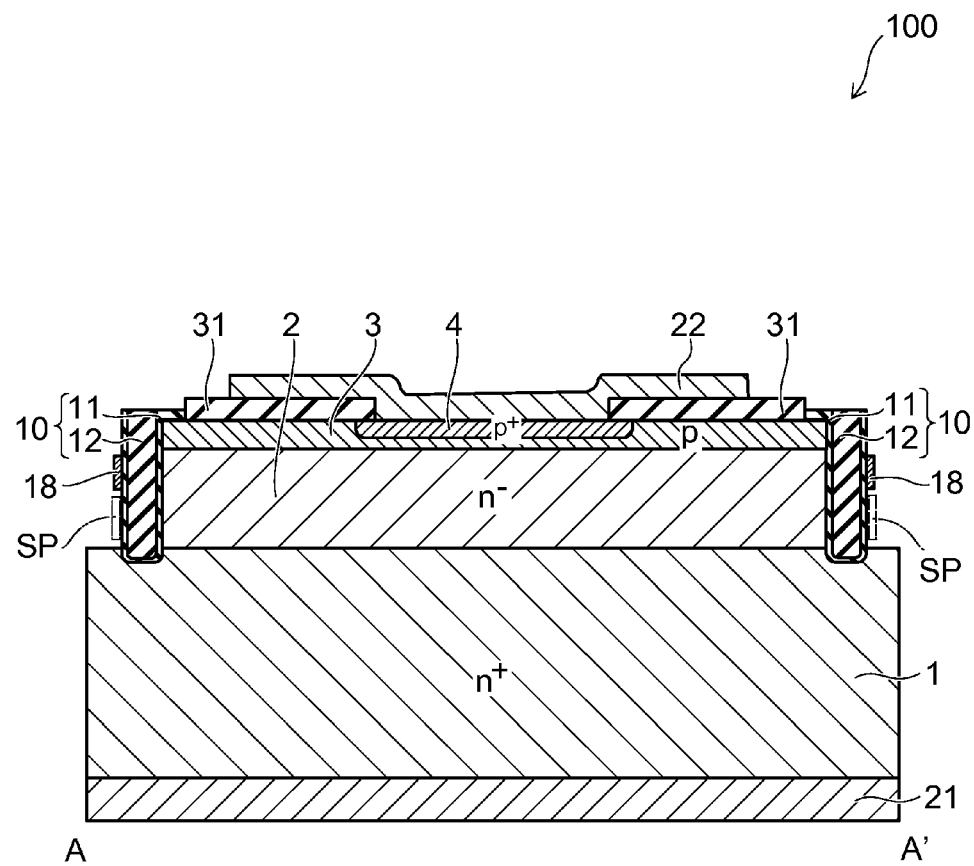
FIG. 2 is a sectional view taken along A-A' of FIG. 1.

FIG. 2 is a sectional view taken along A-A' of FIG. 1.

In FIG. 1, part of the insulating section 10, the anode electrode 22, and the insulating layer 31 are not shown.

The structure of the semiconductor device 100 in the cross section taken along B-B' of FIG. 1 is the same as e.g. the structure of the semiconductor device 100 in the cross section taken along A-A' of FIG. 1 shown in FIG. 2.

The semiconductor device 100 is e.g. a diode.

The semiconductor device 100 includes an $n^+$-type (first conductivity type) semiconductor region 1 (first semiconductor region), an $n^-$-type semiconductor region 2 (second semiconductor region), a p-type (second conductivity type) semiconductor region 3 (third semiconductor region), a $p^+$-type semiconductor region 4, an insulating layer 11, an insulating region 12, a cathode electrode 21, an anode electrode 22, and an insulating layer 31.

As shown in FIG. 1, the $p^+$-type semiconductor region 4 is surrounded with the p-type semiconductor region 3 along the X-Y plane. An insulating section 10 is provided around the p-type semiconductor region 3. A semiconductor section 18 is provided around the insulating section 10.

The shape of the outer edge of the semiconductor device 100 (the outer edge of the $n^+$-type semiconductor region 1) is arbitrary. The shape is e.g. quadrangular as shown in FIG. 1.

As shown in FIG. 2, the cathode electrode 21 is provided below the n+-type semiconductor region 1. The cathode electrode 21 is electrically connected to the n+-type semiconductor region 1.

The n−-type semiconductor region 2 is provided on part of the n+-type semiconductor region 1. The p-type semiconductor region 3 is provided on the n−-type semiconductor region 2. The p+-type semiconductor region 4 is selectively provided on the p-type semiconductor region 3.

The anode electrode 22 is provided on the p+-type semiconductor region 4. In the Z-direction, the insulating layer 31 is provided between part of the anode electrode 22 and part of the p-type semiconductor region 3.

The insulating section 10 is provided on another part of the n+-type semiconductor region 1. The insulating section 10 is provided around the n−-type semiconductor region 2 and the p-type semiconductor region 3 along the X-Y plane.

The −Z-direction end part of the insulating section 10 is in contact with the n+-type semiconductor region 1. However, part of the n−-type semiconductor region 2 may be provided between the −Z-direction end part of the insulating section 10 and the n+-type semiconductor region 1.

The semiconductor section 18 is provided around the insulating section 10 along the X-Y plane. The semiconductor section 18 is not in contact with the n+-type semiconductor region 1, but spaced from the n+-type semiconductor region 1. That is, in the direction (Z-direction) from the n−-type semiconductor region 2 toward the p-type semiconductor region 3, a space SP is provided between the n+-type semiconductor region 1 and the semiconductor section 18. Thus, the semiconductor section 18 is electrically isolated from the semiconductor regions provided between the cathode electrode 21 and the anode electrode 22. Accordingly, the semiconductor section 18 has a floating potential. The semiconductor section 18 may be divided into a plurality around the insulating section 10.

Figure 3:
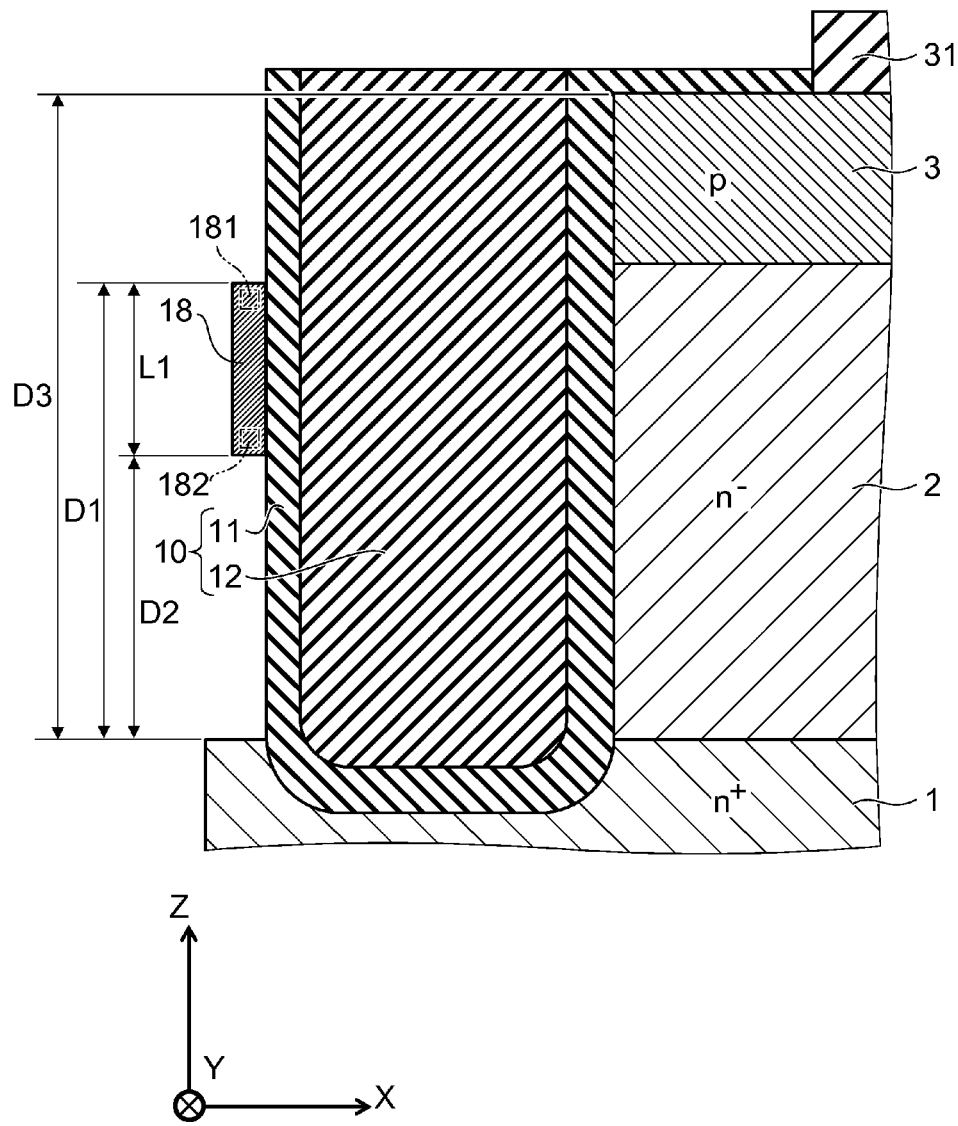
FIG. 3 is a sectional view enlarging part of FIG. 2.

Next, the structure of the insulating section 10 and the semiconductor section 18 is described more specifically with reference to FIG. 3.

FIG. 3 is a sectional view enlarging part of FIG. 2.

As shown in FIGS. 2 and 3, the insulating section 10 includes an insulating layer 11 and an insulating region 12.

The insulating layer 11 is in contact with the n+-type semiconductor region 1, the n−-type semiconductor region 2, and the p-type semiconductor region 3. The insulating layer 11 is provided around part of the n+-type semiconductor region 1, the n−-type semiconductor region 2, and the p-type semiconductor region 3 along the X-Y plane.

The insulating region 12 is provided around part of the insulating layer 11 along the X-Y plane. Another part of the insulating layer 11 is provided around the insulating region 12 along the X-Y plane. That is, except its upper surface, the insulating region 12 is surrounded with the insulating layer 11.

The semiconductor section 18 is provided around the insulating layer 11 and the insulating region 12 along the X-Y plane. The semiconductor section 18 is opposed to the n−-type semiconductor region 2 across the insulating layer 11 and the insulating region 12 in the X-direction and the Y-direction. The semiconductor section 18 may be further opposed to the p-type semiconductor region 3 and the p+-type semiconductor region 4.

The semiconductor section 18 includes a first end part 181 and a second end part 182, which are end parts in the Z-direction. The second end part 182 is located between the first end part 181 and the n+-type semiconductor region 1 in the Z-direction.

Here, the Z-direction distance between the first end part 181 and the n+-type semiconductor region 1 is denoted by D1. The Z-direction distance between the second end part 182 and the n+-type semiconductor region 1 is denoted by D2.

The Z-direction distance between the upper surface of the p-type semiconductor region 3 (the upper surface of the p+-type semiconductor region 4) and the n+-type semiconductor region 1 is denoted by D3. The Z-direction length of the semiconductor section 18 is denoted by L1.

Figure 4:
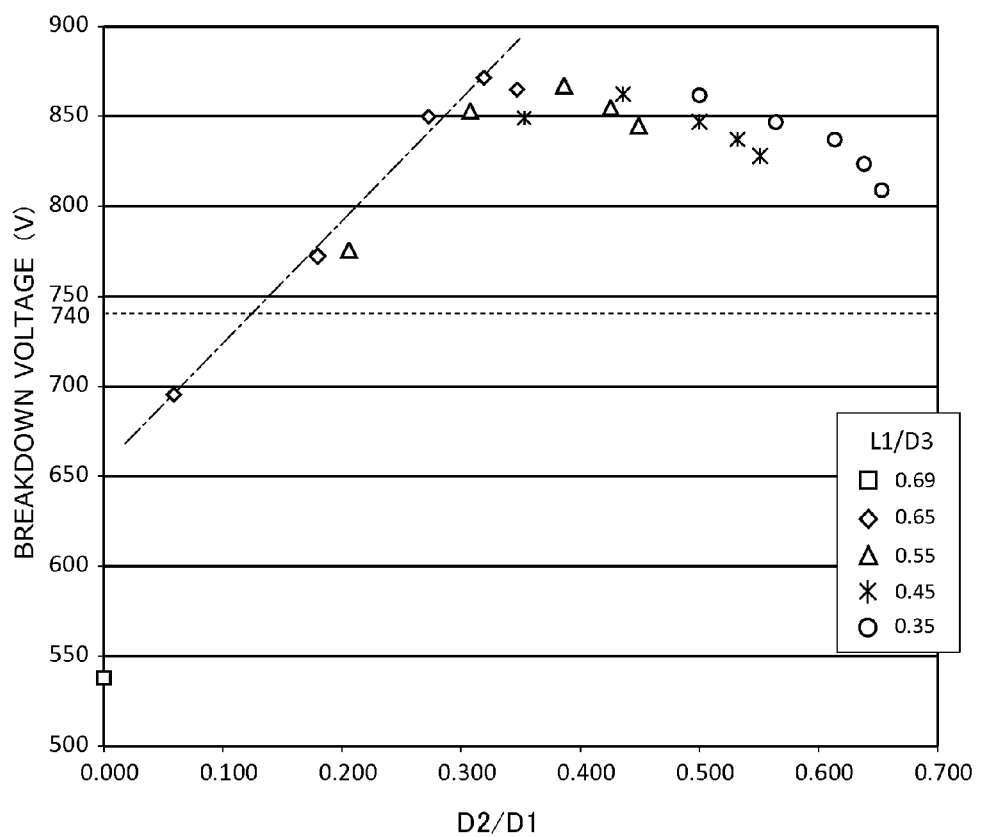
FIG. 4 is a graph illustrating the characteristic of the semiconductor device 100 according to the first embodiment.

FIG. 4 is a graph illustrating the characteristic of the semiconductor device 100 according to the first embodiment. Specifically, FIG. 4 shows the result of simulating the change of the breakdown voltage of the semiconductor device 100 with respect to the change of D2/D1 and L1/D3.

In FIG. 4, the horizontal axis represents D2/D1. The vertical axis represents the breakdown voltage of the semiconductor device. The points in the graph represent the breakdown voltage for values of L1/D3 as follows. Squares represent the breakdown voltage for 0.69, diamonds for 0.65, triangles for 0.55, asterisks for 0.45, and circles for 0.35.

It is found from FIG. 4 that the breakdown voltage of the semiconductor device increases with D2/D1 in the range of D2/D1 of approximately 0.4 or less. As indicated by the dot-dashed line in FIG. 4, it is also found that the breakdown voltage increases nearly linearly with D2/D1 in the range of D2/D1 of approximately 0.3 or less. The dot-dashed line is a straight line connecting between the point of D2/D1 being 0.059 and the breakdown voltage being 695.4 V and the point of D2/D1 being 0.319 and the breakdown voltage being 871.5 V.

On the other hand, simulation was performed on a semiconductor device according to a comparative example. The semiconductor device has a structure similar to that of the semiconductor device 100 except that the semiconductor section 18 is not provided. According to this simulation, the breakdown voltage was 740 V.

Here, the dot-dashed line shown in FIG. 4 is expressed by the following equation (1).

$$V = 677 \times (D2/D1) + 655 \qquad (1)$$

V represents the breakdown voltage of the semiconductor device. The fractional part of the numerical values is omitted.

Substituting the breakdown voltage of the semiconductor device according to the comparative example, 740 V, into equation (1), the value of D2/D1 is calculated as approximately 0.125. It is found from this result that a semiconductor device having a higher breakdown voltage than the semiconductor device according to the comparative example is obtained when D2/D1 is 0.125 or more.

Next, an example method for manufacturing the semiconductor device 100 is described with reference to FIG. 5 to FIG. 12.

Figure 5:
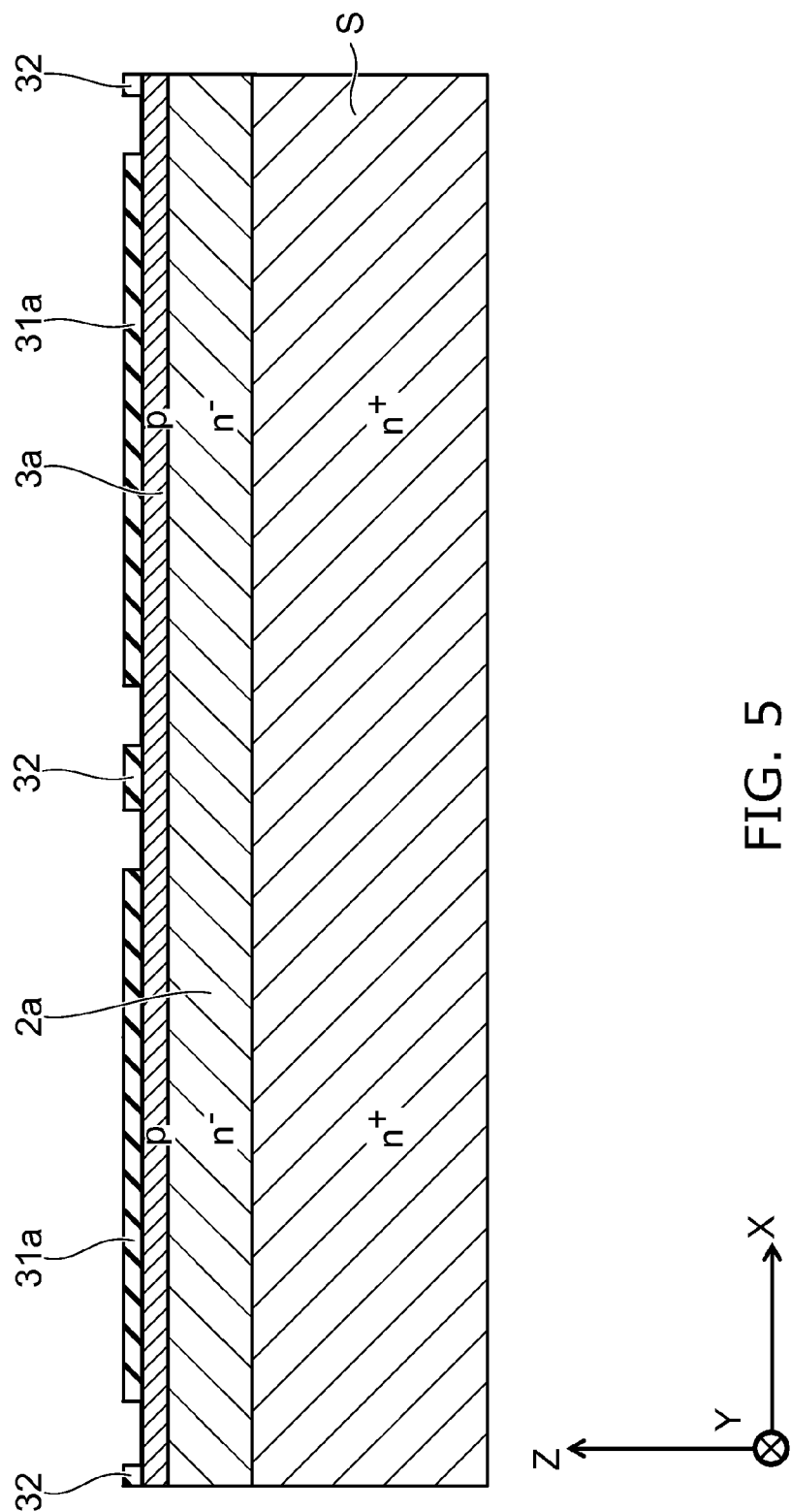
FIG. 5 is a process sectional view showing the process for manufacturing the semiconductor device according to this embodiment.
Figure 6:
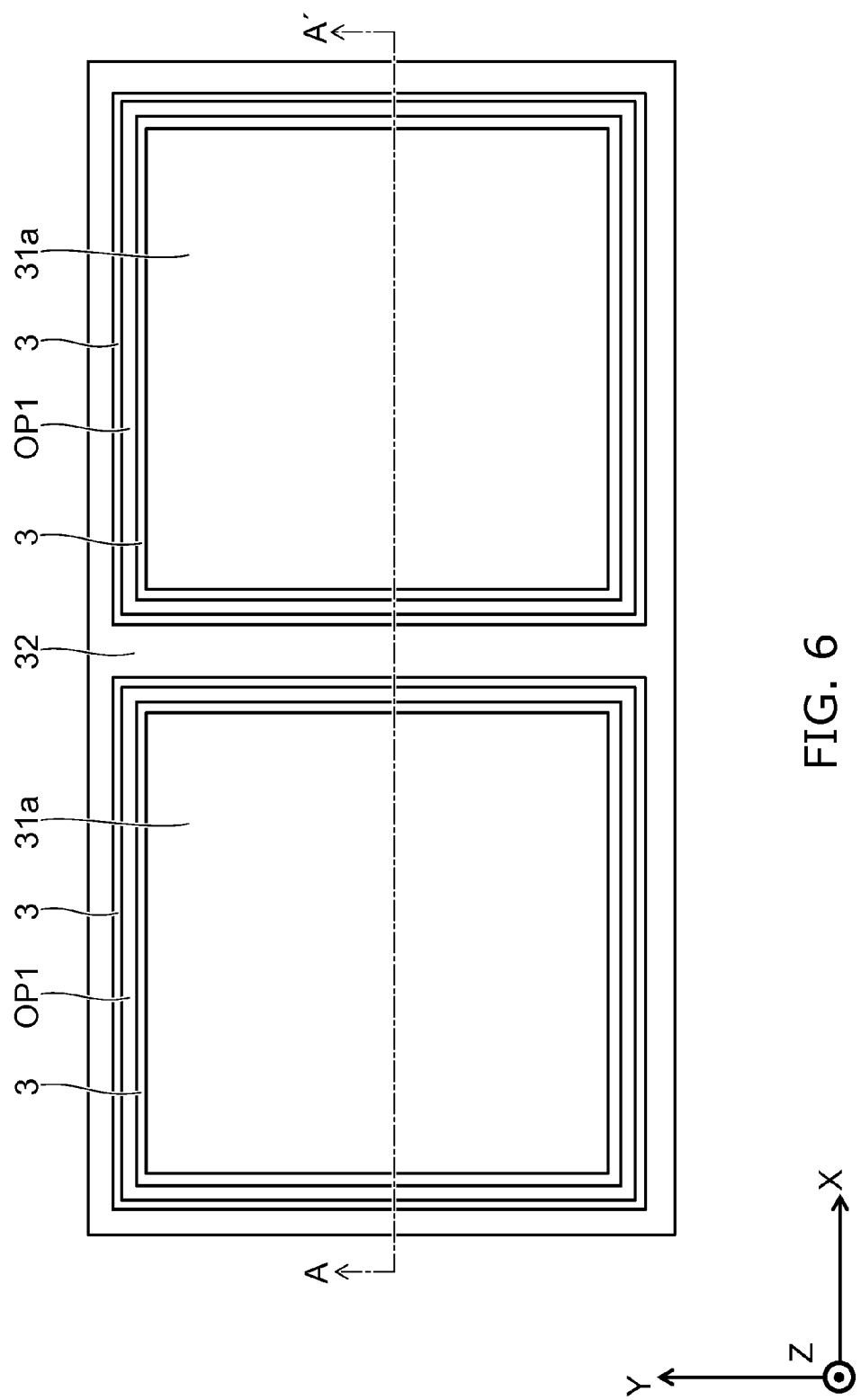
FIG. 6 is a process plan view showing a process for manufacturing the semiconductor device according to this embodiment.
Figure 9:
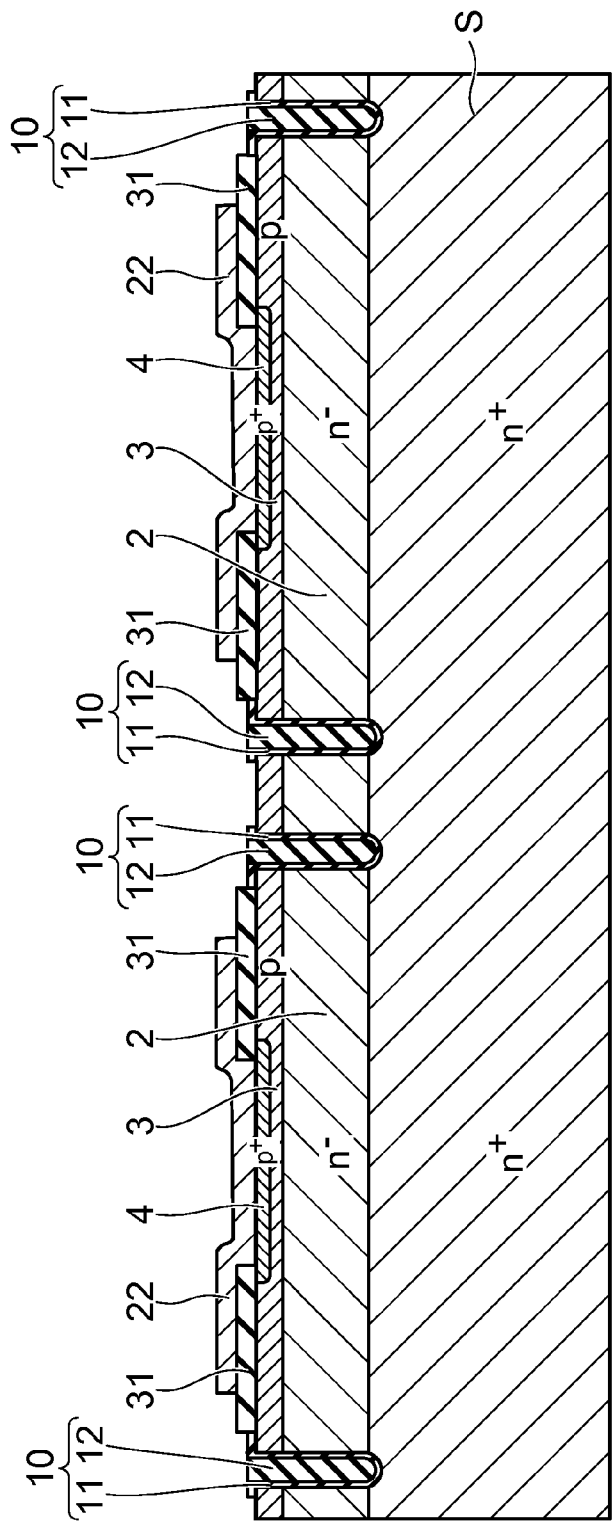
Figure 10:
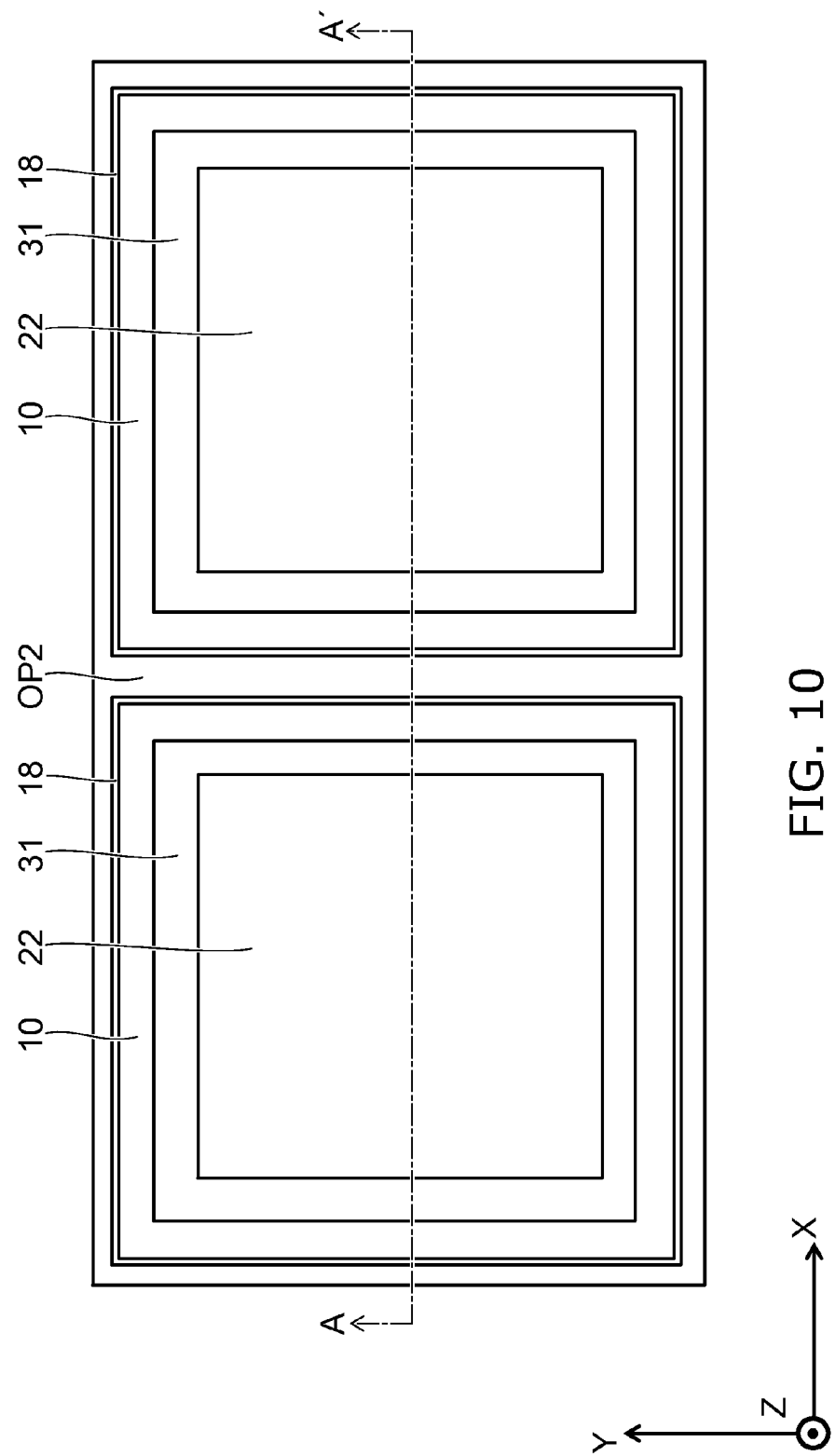
FIG. 10 is a process plan view showing a process for manufacturing the semiconductor device according to this embodiment.

FIGS. 6 and 10 are process plan views showing a process for manufacturing the semiconductor device 100 according to this embodiment. FIGS. 5, 7 to 9, 11, and 12 are process sectional views showing the process for manufacturing the semiconductor device 100 according to this embodiment.

Figure 7:
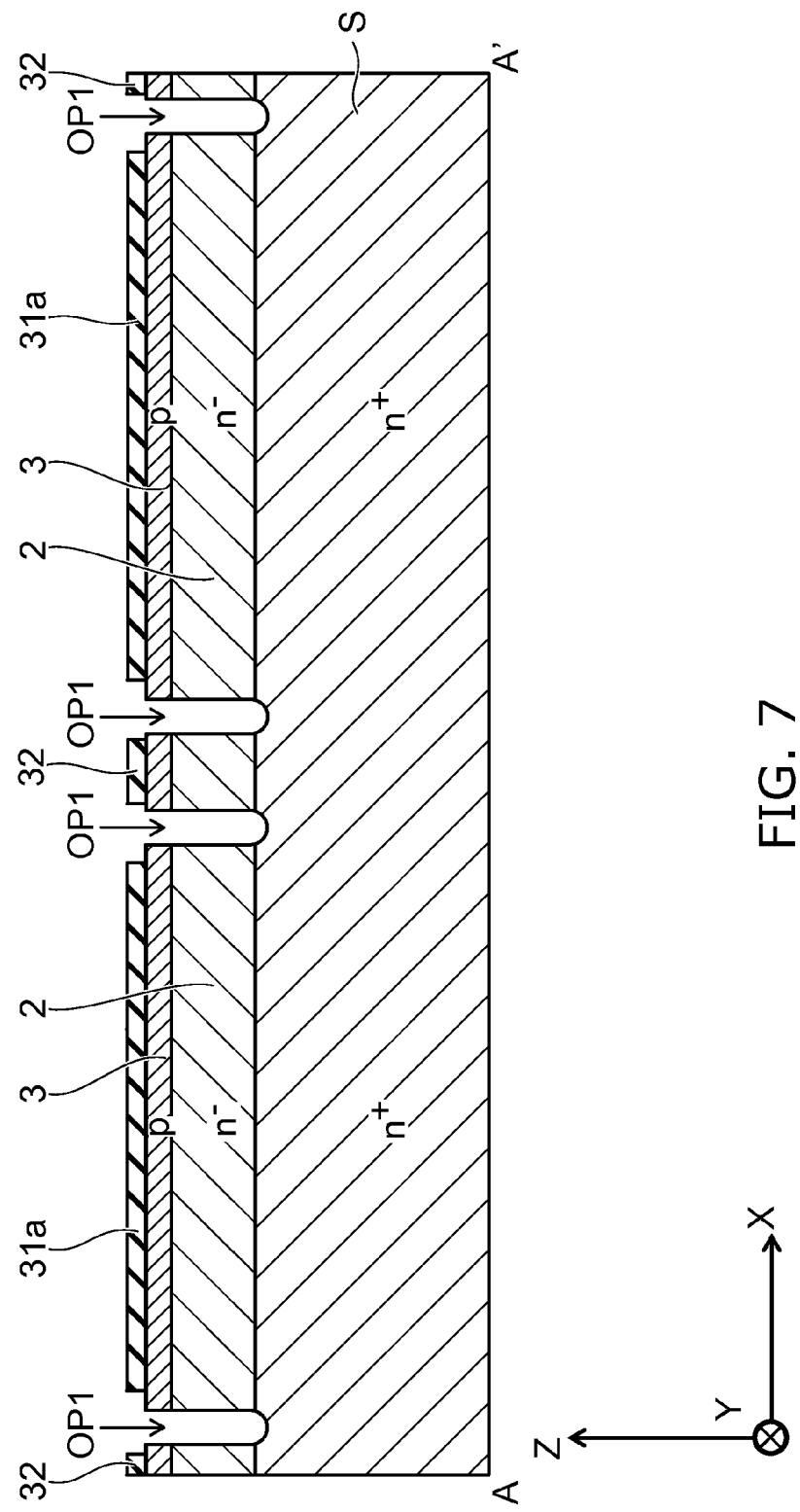
FIGS. 7 to 9 are process sectional views showing the process for manufacturing the semiconductor device according to this embodiment.
Figure 11:
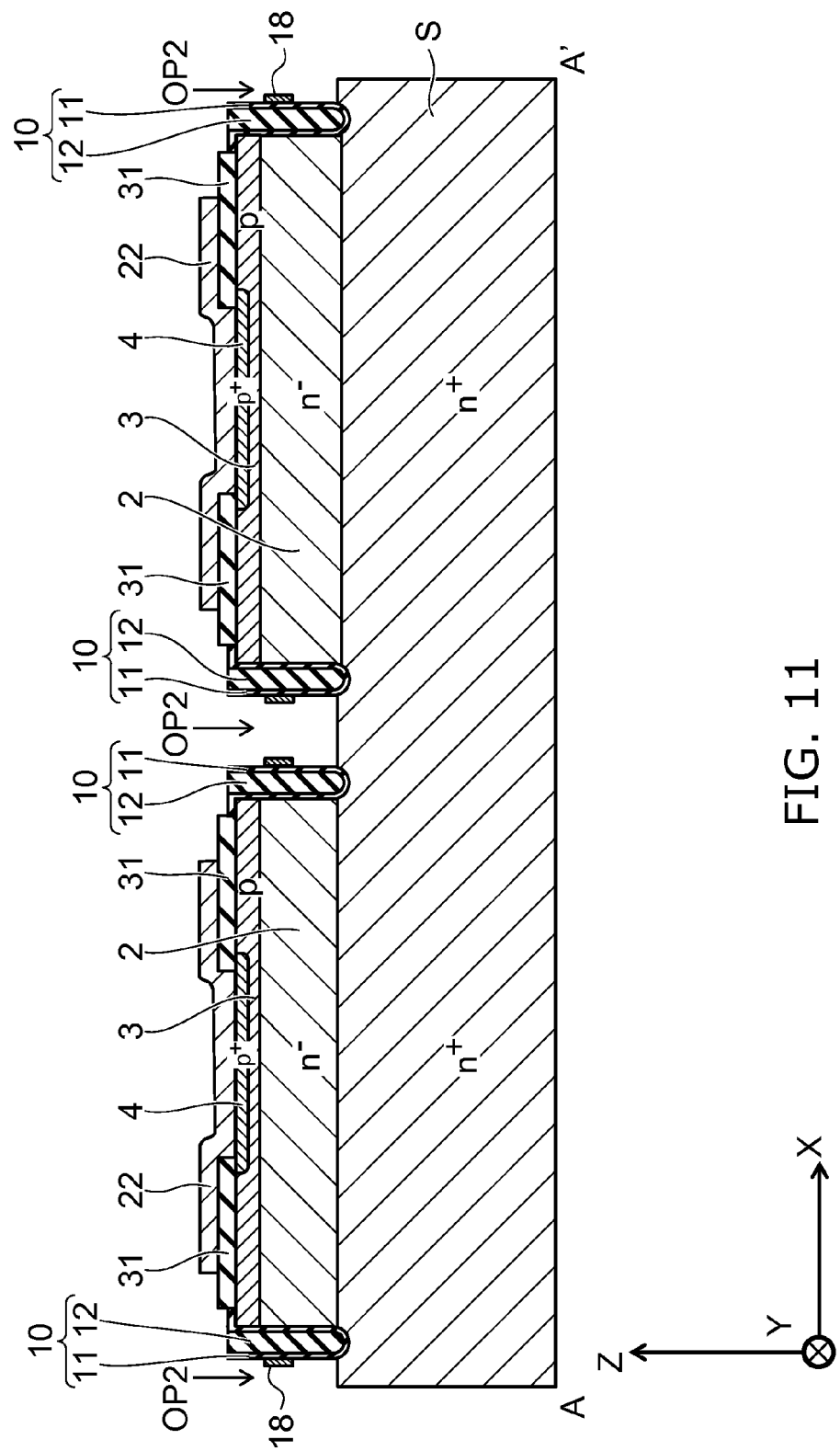
FIGS. 11 and 12 are process sectional views showing the process for manufacturing the semiconductor device according to this embodiment.

FIG. 7 shows a cross section taken along A-A' of FIG. 6. FIG. 11 shows a cross section taken along A-A' of FIG. 10. FIGS. 5, 8, 9, and 11 are sectional views at the position corresponding to the position of line A-A' of FIGS. 6 and 10.

First, an n+-type semiconductor substrate S (hereinafter referred to as substrate S) is prepared. The substrate S is composed primarily of silicon (Si). The substrate S may be composed primarily of gallium arsenide, silicon carbide, or gallium nitride.

In the following description, it is assumed that the substrate S is composed primarily of Si.

Si is epitaxially grown on the substrate S while adding an n-type impurity such as phosphorus or arsenic. Thus, an n⁻-type semiconductor layer 2a is formed. Next, Si is epitaxially grown on the n⁻-type semiconductor layer 2a while adding a p-type impurity such as boron. Thus, a p-type semiconductor layer 3a is formed. An insulating layer is formed on the p-type semiconductor layer 3a. This insulating layer is patterned to form an insulating layer 31a and an insulating layer 32a. The state at this time is shown in FIG. 5.

Next, as shown in FIGS. 6 and 7, an opening OP1 is formed in the n⁻-type semiconductor layer 2a and the p-type semiconductor layer 3a. The opening OP1 reaches e.g. the substrate S as shown in FIGS. 6 and 7. This step divides the n⁻-type semiconductor layer 2a and the p-type semiconductor layer 3a into a plurality. Thus, the n⁻-type semiconductor region 2 and the p-type semiconductor region 3 shown in FIGS. 1 to 3 are formed.

The opening OP1 is formed by photolithography technique and RIE (reactive ion etching) technique. As shown in FIG. 6, the opening OP1 is formed in a ring shape so as to surround part of the n⁻-type semiconductor layer 2a and part of the p-type semiconductor layer 3a along the X-Y plane.

Next, a silicon oxide film is formed as an insulating layer 11 on the inner wall of the opening OP1 by thermal oxidation. This step terminates the dangling bonds of Si exposed to the inner wall of the opening OP1. Before thermal oxidation, the portion damaged by RIE technique may be removed by CDE (chemical dry etching) technique or wet etching technique.

Figure 8:
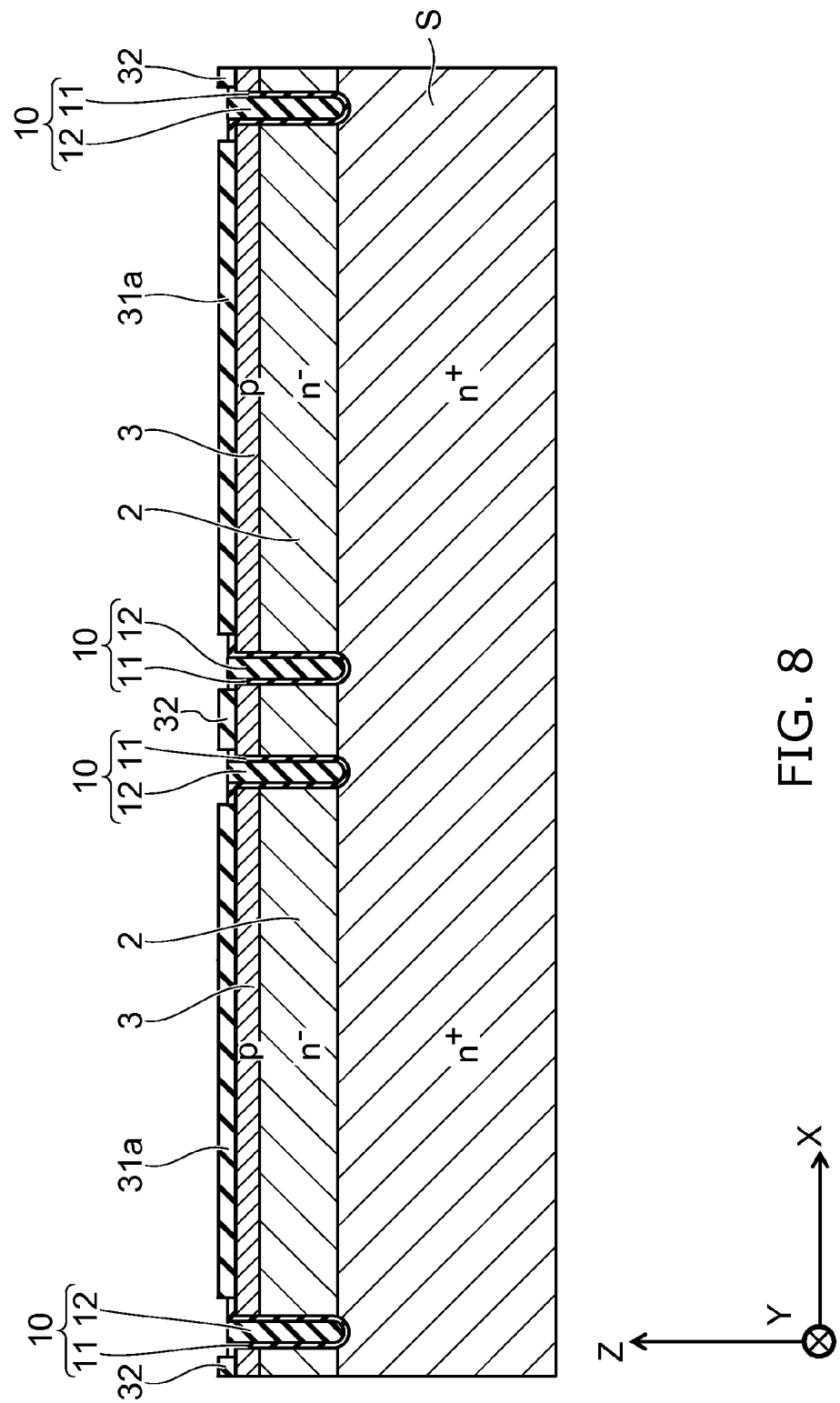

Next, as shown in FIG. 8, an insulating material such as silicon oxide is embedded inside the opening OP1 on which the insulating layer 11 has been formed. Thus, an insulating region 12 is formed. The excess insulating material deposited on the insulating layer 31a can be removed by CMP (chemical mechanical polishing) technique.

Next, part of the insulating layer 31a is removed so as to expose part of the p-type semiconductor region 3. At this time, the insulating layer 32 is simultaneously removed. Next, a p-type impurity is partly ion implanted into the p-type semiconductor region 3 using a mask, not shown. Thus, a p⁺-type semiconductor region 4 is formed. Next, a metal layer is formed on the p⁺-type semiconductor region 4. This metal layer is patterned to form an anode electrode 22 as shown in FIG. 9.

Next, a mask, not shown, covering at least part of the insulating section 10, the anode electrode 22, and the insulating layer 31 is formed. Next, using this mask, the portion of the n⁻-type semiconductor layer 2a and the p-type semiconductor layer 3a partitioned by a plurality of openings OP1 other than the n⁻-type semiconductor region 2 and the p-type semiconductor region 3 is removed by RIE technique.

At this time, part of the n⁻-type semiconductor layer 2a and part of the p-type semiconductor layer 3a are removed while forming a semiconductor section 18 around the insulating section 10. This step is performed using e.g. the Bosch process.

Specifically, first, part of the p-type semiconductor layer 3a is etched using a mask, not shown. Sulfur fluoride gas such as $SF_6$ can be used in this etching. Next, a protective film is formed on the sidewall of the insulating section 10 using carbon fluoride gas such as $C_4F_8$. Next, the protective film deposited on the region not covered with the mask is removed. Then, part of the p-type semiconductor layer 3a is etched again. Subsequently, a protective film is formed again on the sidewall of the insulating section 10. The foregoing procedure is repeated to remove part of the n⁻-type semiconductor layer 2a and part of the p-type semiconductor layer 3a. Thus, an opening OP2 is formed.

At this time, at the position to be provided with a semiconductor section 18, part of the n⁻-type semiconductor layer 2 is not removed but left by decreasing the etching rate in the X-direction and the Y-direction (i.e., isotropic etching component). Thus, a semiconductor section 18 is formed. Alternatively, the film thickness of the protective film formed at the position to be provided with a semiconductor section 18 is made thicker than the film thickness of the protective film formed at the other position. Thus, part of the n⁻-type semiconductor layer 2 is not removed but left. Accordingly, a semiconductor section 18 is formed. The state in which the opening OP2 and the semiconductor section 18 have been formed is shown in FIGS. 10 and 11.

Figure 12:
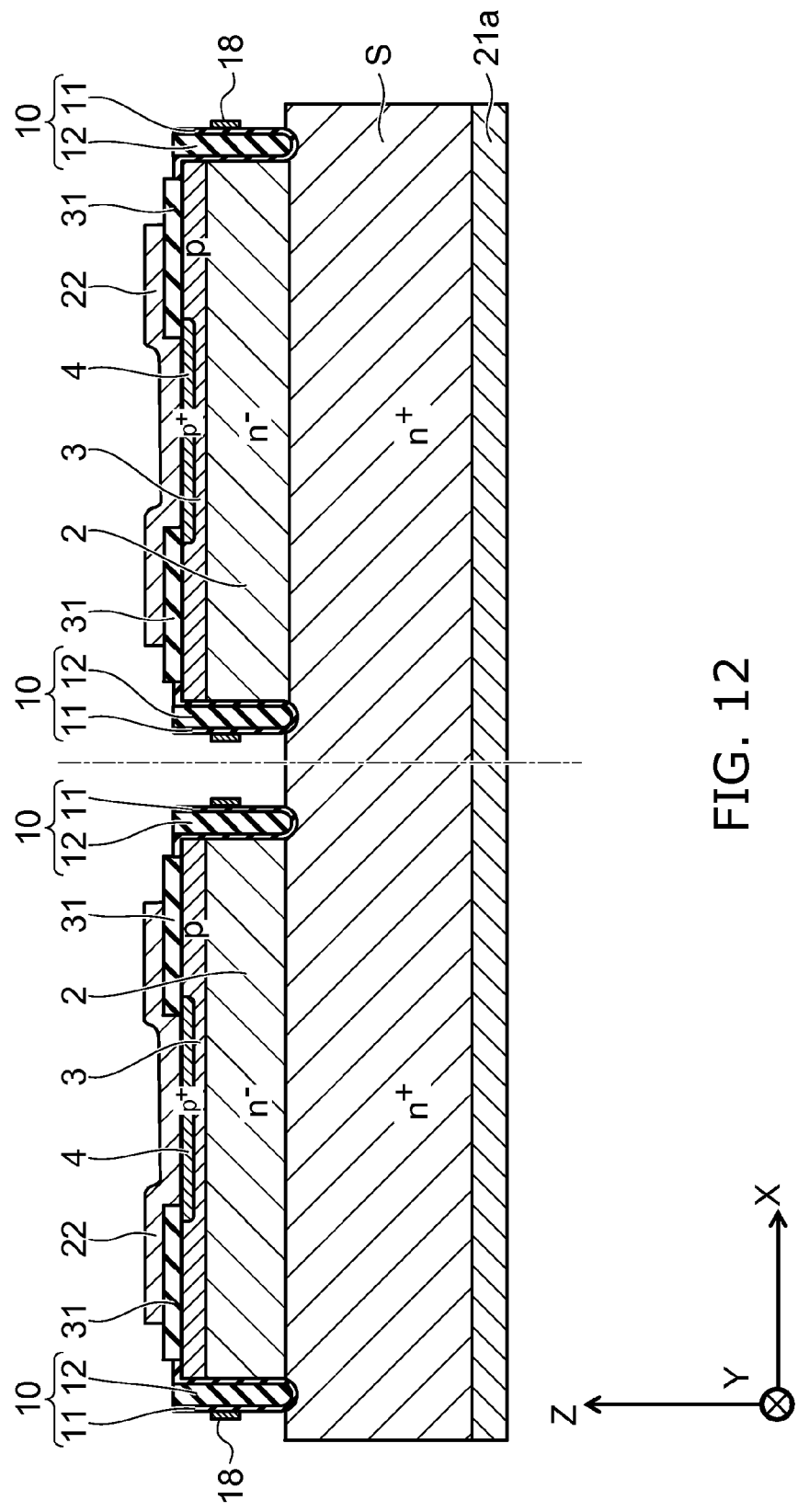

Next, the back surface of the substrate S is polished until the substrate S reaches a prescribed thickness. Next, as shown in FIG. 12, a cathode electrode 21a is formed on the back surface of the substrate S. Then, dicing is performed at the position indicated by the dashed line of FIG. 12. Thus, the substrate S and the cathode electrode 21a are divided into a plurality. Accordingly, the semiconductor device 100 shown in FIGS. 1 to 3 is obtained. The method for dicing can be e.g. mechanical dicing using a blade, laser dicing, or plasma dicing using RIE technique.

Next, the function and effect according to this embodiment are described with reference to FIG. 13.

Figure 13:
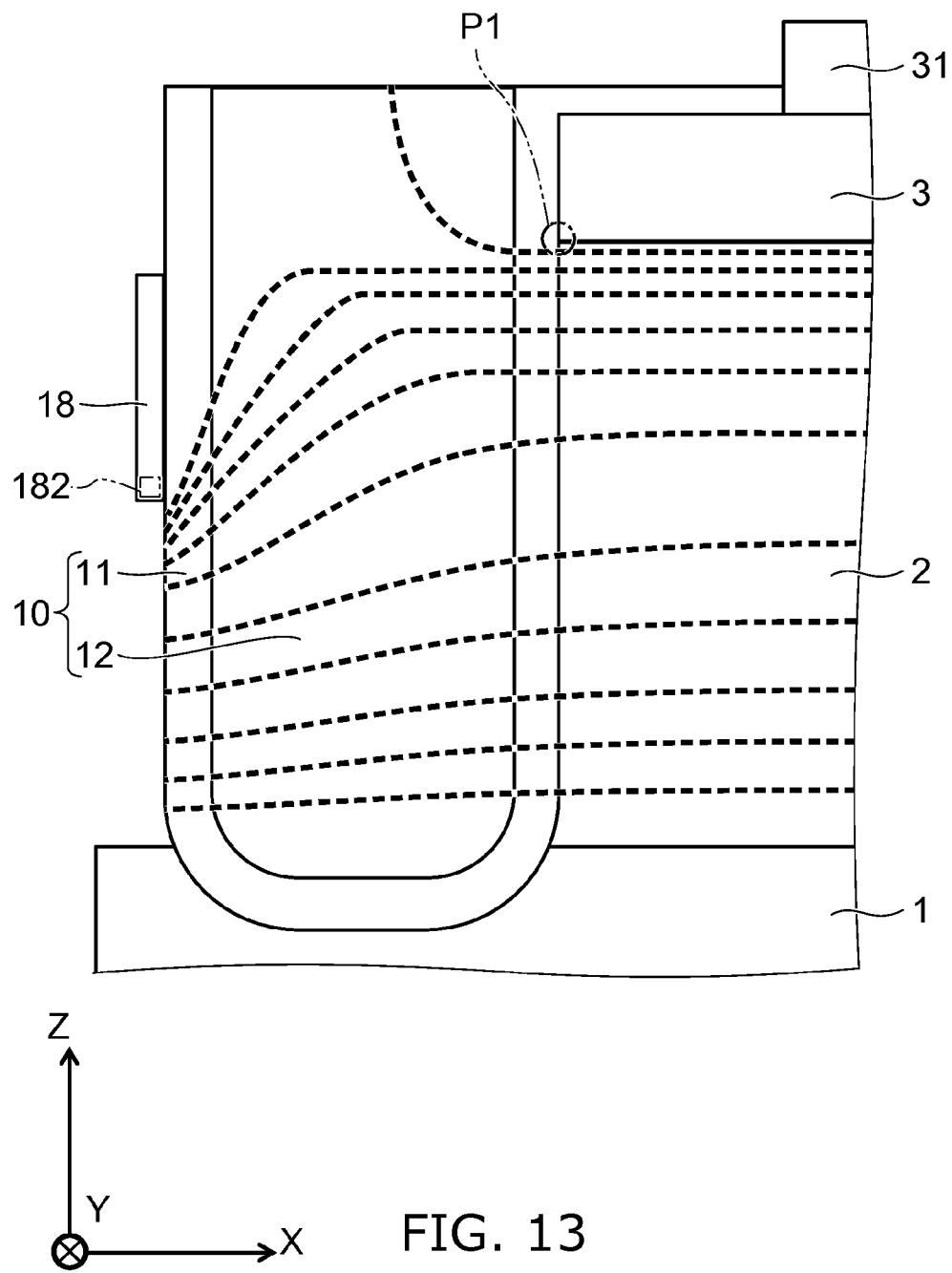
FIG. 13 is an enlarged sectional view illustrating the characteristic of the semiconductor device according to the first embodiment.

FIG. 13 is an enlarged sectional view illustrating the characteristic of the semiconductor device 100 according to the first embodiment. Specifically, the dashed lines in FIG. 13 schematically represent equipotential lines in the state in which the anode electrode 22 is applied with a positive voltage relative to the cathode electrode 21.

As shown in FIG. 13, the equipotential line extends along the p-n junction interface between the n⁻-type semiconductor region 2 and the p-type semiconductor region 3. The equipotential line extending along the p-n junction interface crosses generally perpendicularly to the contact interface between the insulating layer 11 and the n⁻-type semiconductor region 2. Parts of the equipotential lines are bent to the anode electrode 22 side along the p-type semiconductor region 3. Another part of the equipotential lines are bent to the cathode electrode 21 side so as to pass between the second end part 182 of the semiconductor section 18 and the n⁺-type semiconductor region 1.

This is because the potential of the semiconductor section 18 increases with the increase of the potential of the anode electrode 22 when the anode electrode 22 is applied with voltage.

On the other hand, in the semiconductor device according to the comparative example without the semiconductor section 18, more equipotential lines are bent to the anode electrode 22 side along the p-type semiconductor region 3 in the insulating section 10. This increases the electric field intensity in the end portion P1 of the p-n junction interface between the n⁻-type semiconductor region 2 and the p-type semiconductor region 3.

That is, in the semiconductor device according to this embodiment provided with the semiconductor section 18, equipotential lines bent to the anode electrode 22 side along the p-type semiconductor region 3 can be decreased. This can reduce the electric field intensity in the portion P1. As a result, the breakdown voltage of the semiconductor device can be increased.

Here, as described with reference to FIG. 4, preferably, D2/D1 is 0.125 or more. More preferably, D2/D1 is 0.25 or more. This is because a more preferable breakdown voltage of 800 V or more is obtained when D2/D1 is 0.25 or more as shown in FIG. 4.

Second Embodiment

Figure 14:
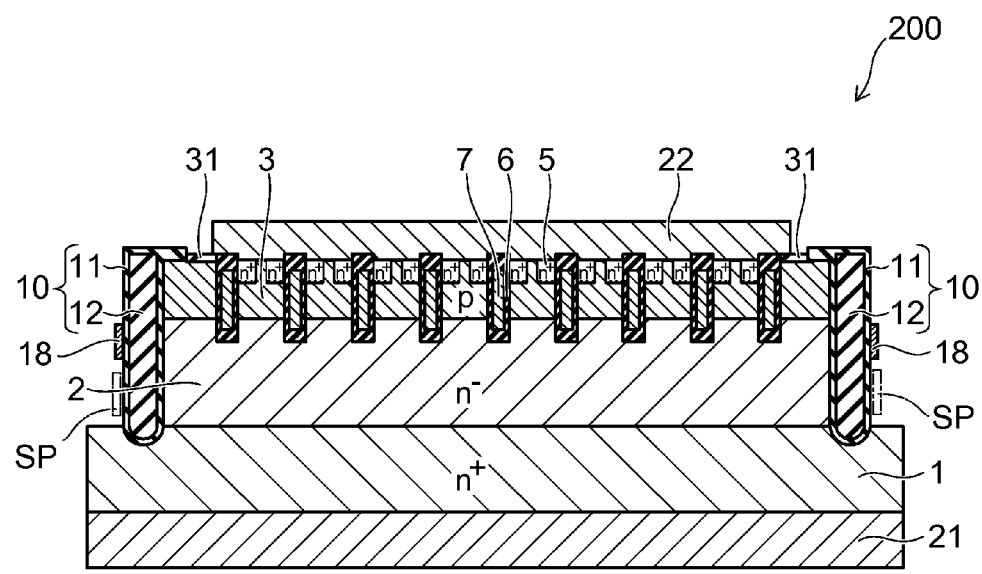
FIG. 14 is a sectional view of a semiconductor device according to a second embodiment.
Figure 14:
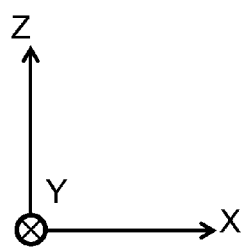

FIG. 14 is a sectional view of a semiconductor device 200 according to a second embodiment.

The semiconductor device 200 is e.g. a MOSFET.

The semiconductor device 200 includes an $n^+$-type drain region 1 (first semiconductor region), an $n^-$-type semiconductor region 2 (second semiconductor region), a p-type base region 3 (third semiconductor region), an $n^+$-type source region 5 (fourth semiconductor region), a gate insulating layer 6, a gate electrode 7, an insulating layer 11, an insulating region 12, a drain electrode 21, a source electrode 22, and an insulating layer 31.

FIG. 14 shows the semiconductor device 200 in the X-Z cross section. The structure of the semiconductor device 200 in the Y-Z cross section is the same as e.g. the structure in the X-Z cross section shown in FIG. 14.

In this embodiment, the structure of the $n^+$-type drain region 1, the $n^-$-type semiconductor region 2, the insulating section 10, the drain electrode 21, and the source electrode 22 can be made similar to the structure of the $n^+$-type semiconductor region 1, the $n^-$-type semiconductor region 2, the insulating section 10, the cathode electrode 21, and the anode electrode 22 in the first embodiment.

The p-type base region 3 is selectively provided on the $n^-$-type semiconductor region 2. The $n^+$-type source region 5 is selectively provided on the p-type base region 3. In the X-direction, the gate insulating layer 6 is provided between the gate electrode 7 and part of the $n^-$-type semiconductor region 2, the p-type base region 3, and part of the $n^+$-type source region 5.

The source electrode 22 is provided on the p-type base region 3 and on the $n^+$-type source region 5. The source electrode 22 is electrically connected to the $n^+$-type source region 5. An insulating layer is provided between the gate electrode 7 and the source electrode 22. The gate electrode 7 is electrically isolated from the source electrode 22.

The insulating section 10 is provided around the $n^-$-type semiconductor region 2 and the p-type base region 3 along the X-Y plane. A semiconductor section 18 is provided around the insulating section 10 along the X-Y plane.

The drain electrode 21 is applied with a positive voltage relative to the source electrode 22. In this state, the gate electrode 7 is applied with a voltage higher than or equal to the threshold. This turns on the MOSFET. At this time, a channel (inversion layer) is formed in the region of the p-type base region 3 near the gate insulating layer 6.

According to this embodiment, as in the first embodiment, the breakdown voltage of the semiconductor device can be increased by the semiconductor section 18 provided therein.

In the example shown in FIG. 14, the semiconductor device 200 is a trench-type MOSFET in which the gate electrode is provided in the semiconductor layer. However, the semiconductor device 200 may be a planar-type MOSFET in which the gate electrode 7 is provided on the surface of the semiconductor layer. In the case where the semiconductor device 200 is a planar-type MOSFET, the gate electrode 7 is provided via the gate insulating layer 6 on part of the $n^-$-type semiconductor region 2, the p-type base region 3, and part of the $n^+$-type source region 5.

Alternatively, the semiconductor device 200 may be an IGBT. In the case where the semiconductor device 200 is an IGBT, the semiconductor device 200 further includes a $p^+$-type semiconductor region provided between the cathode electrode 21 and the $n^+$-type semiconductor region 1.

The relative magnitude of the impurity concentration between the semiconductor regions in the embodiments described above can be confirmed using e.g. SCM (scanning capacitance microscopy). The carrier concentration in each semiconductor region can be regarded as being equal to the concentration of impurity activated in the semiconductor region. Thus, the relative magnitude of the carrier concentration between the semiconductor regions can also be confirmed using SCM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. One skilled in the art can appropriately select specific configurations of components included in the embodiments, for example the $n^+$-type semiconductor region, the $n^-$-type semiconductor region, the p-type semiconductor region, the $p^+$-type semiconductor region, the p-type base region, the $n^+$-type source region, the cathode electrode, the anode electrode, etc., from known art. The accompanying claims and their equivalents are intended to cover such forms or modifications as would fall within the scope and spirit of the invention.

What is claimed is:

1. A semiconductor device comprising:
   a first semiconductor region of a first conductivity type;
   a second semiconductor region of the first conductivity type provided on the first semiconductor region, a carrier concentration of the first conductivity type of the second semiconductor region being lower than a carrier concentration of the first conductivity type of the first semiconductor region;
   a third semiconductor region of a second conductivity type provided on the second semiconductor region;
   an insulating section provided around the first semiconductor region and the second semiconductor region, the insulating section being in contact with the second semiconductor region; and
   a semiconductor section provided around the insulating section, the semiconductor section being not in contact with the first semiconductor region.

2. The device according to claim 1, wherein a space is provided between the first semiconductor region and the semiconductor section.

3. The device according to claim 2, wherein
   the semiconductor section includes a first end part and a second end part in a first direction,
   the first direction is from the second semiconductor region toward the third semiconductor region,
   the second end part is located between the first end part and the first semiconductor region in the first direction, and
   D1 defined as a distance between the first end part and the first semiconductor region in the first direction, and D2 defined as a distance between the second end part and the first semiconductor region in the first direction, satisfy D2/D1≥0.125.

4. The device according to claim 3, wherein D1 and D2 satisfy D2/D1≥0.25.

5. The device according to claim 1, further comprising:
a fourth semiconductor region of the first conductivity type selectively provided on the second semiconductor region;
a gate electrode; and
a gate insulating layer provided between the gate electrode and the second semiconductor region.

6. The device according to claim 1, wherein
the semiconductor section includes a semiconductor material, and
the insulating section includes an oxide of the semiconductor material.

7. The device according to claim 1, wherein potential of the semiconductor section is floating.

8. A semiconductor device comprising:
a first semiconductor region of a first conductivity type;
a second semiconductor region of the first conductivity type provided on the first semiconductor region, a carrier concentration of the first conductivity type of the second semiconductor region being lower than a carrier concentration of the first conductivity type of the first semiconductor region;
a third semiconductor region of a second conductivity type provided on the second semiconductor region;
an insulating section provided around the first semiconductor region and the second semiconductor region, the insulating section being in contact with the second semiconductor region; and
a semiconductor section provided around the insulating section, the semiconductor section being electrically isolated from the first semiconductor region.

9. The device according to claim 8, wherein
the semiconductor section includes a semiconductor material, and
the insulating section includes an oxide of the semiconductor material.

10. The device according to claim 8, wherein potential of the semiconductor section is floating.

* * * * *